United States Patent
Nagatomo

(10) Patent No.: US 9,831,878 B2
(45) Date of Patent: Nov. 28, 2017

(54) SEMICONDUCTOR DEVICE AND SELECTOR CIRCUIT

(71) Applicant: LAPIS Semiconductor Co., Ltd., Yokohama (JP)

(72) Inventor: Shigeru Nagatomo, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/291,677

(22) Filed: Oct. 12, 2016

(65) Prior Publication Data

US 2017/0104488 A1    Apr. 13, 2017

(30) Foreign Application Priority Data

Oct. 13, 2015  (JP) .................................. 2015-202223

(51) Int. Cl.
 *H03K 19/0185* (2006.01)
 *H01L 27/092* (2006.01)
 *H03K 3/36* (2006.01)
 *H03K 3/356* (2006.01)
 (Continued)

(52) U.S. Cl.
CPC ... *H03K 19/018521* (2013.01); *H01L 27/092* (2013.01); *H03K 3/356113* (2013.01); *H03K 3/356165* (2013.01); *H03K 3/36* (2013.01); *H03K 17/223* (2013.01); *H01L 29/0684* (2013.01)

(58) Field of Classification Search
CPC .. H03K 3/02332; H03K 3/0372; H03K 3/289; H03K 3/3562; H03K 3/35625; H03K 3/3565; H03K 3/353; H03K 3/356104; H03K 19/018521; H03K 19/018571; H03K 19/0948; H03K 3/12; H03K 17/223; H03K 3/012; H03K 3/0375; H03K 17/102; H03K 17/22; H03K 19/0027; H03K 19/1776; H03K 19/17784; H03K 19/17792; H03K 3/0231; H03K 3/03; H03K 3/037; H03K 3/356008; H03K 3/356139; H03K 3/356165; G11C 11/4125; G11C 11/417
See application file for complete search history.

(56) References Cited

U.S. PATENT DOCUMENTS

| | | | | |
|---|---|---|---|---|
| 7,002,371 | B2* | 2/2006 | Kase ................ | H03K 3/356008 326/119 |
| 7,622,954 | B2* | 11/2009 | Illegems .......... | H03K 3/356182 326/68 |
| 2013/0121070 | A1* | 5/2013 | Glorieux ............... | G11C 19/28 365/182 |

FOREIGN PATENT DOCUMENTS

JP    2008-177755 A    7/2008

* cited by examiner

*Primary Examiner* — Vibol Tan
(74) *Attorney, Agent, or Firm* — Rabin & Berdo, P.C.

(57) ABSTRACT

A semiconductor device includes a setting circuit and a reset circuit. The setting circuit includes a latch circuit having first and second inverters driven by a first power voltage whose level is fixed and a first transistor which is switched between an ON state and an OFF state on the basis of a level of a second power voltage whose level varies depending on a surrounding environment, and sets data corresponding to a reference voltage to the latch circuit in response to the first transistor being switched to the ON state. The reset circuit includes an N-type second transistor connected to an output of the first inverter and an input of the second inverter. The second transistor sets data corresponding to the reference voltage to the latch circuit in response to the second voltage being equal to or lower than a predetermined voltage value.

11 Claims, 7 Drawing Sheets

(51) Int. Cl.
*H03K 17/22* (2006.01)
*H01L 29/06* (2006.01)

SEMICONDUCTOR DEVICE AND SELECTOR CIRCUIT

BACKGROUND OF THE INVENTION

Technical Field

The present invention relates to a semiconductor device and to a selector circuit.

Background Art

When exchanging signals between circuits driven at differing voltages, there are cases in which the threshold voltages, at which the signals of the respective circuits are recognized as high level (hereinafter referred to as "H"), differ. In such a case, a level shifting circuit that converts signal levels is connected between the respective circuits.

When the level shifting circuit receives an "H" signal level from one circuit, for example, the level shifting circuit converts the signal to a level that would be recognized as "H" in the other circuit, thereby achieving consistency in signal levels (see, for example Japanese Patent Application Laid-Open Publication No. 2008-177755.

SUMMARY OF THE INVENTION

Meanwhile, in recent years, with an increased awareness among the general public concerning environmental problems, renewable energy sources employing solar panels and the like have garnered attention, for example, and as a result, electronic devices driven by power generated by solar panels are becoming increasingly popular.

For example, solar panels are sometimes used as the power source for electronic devices such as clocks or calculators that consume less current than communication devices such as mobile phones. However, if solar panels are used as the power source, then the output voltage of the solar panel sometimes fluctuates due to the varying amounts of light hitting the solar panel. Thus, electronic devices that use power generated by solar panels can often also be driven by batteries such as lithium-ion batteries, which output a predetermined voltage.

In electronic devices that use both solar panels and batteries as power sources, if the output voltage from the solar panel is greater than or equal to a threshold voltage, then the solar panel is selected as the power source, and if the output voltage from the solar panel is less than the threshold voltage, then the battery is selected as the power source, thereby increasing the lifespan of the battery.

Thus, in such electronic devices, a circuit driven by a voltage such as the output voltage of the solar panel, which fluctuates depending on the environment in which the solar panel is installed, and a circuit driven by a voltage with less fluctuation than the output voltage of a solar panel, such as the output voltage of a battery, are sometimes used jointly.

In other words, the level shifting circuit, which converts signal levels, is used because there are cases in which the signal level needs to be converted between circuits driven at differing voltages.

However, Japanese Patent Application Laid-Open Publication No. 2008-177755 discloses a level shifting circuit disposed between circuits driven by a digital circuit power source and an analog circuit power source, which respectively output predetermined voltages, and use of such a level shifting circuit is not anticipated for cases in which level conversion is to be performed on a circuit driven by a power source in which the voltage fluctuates according to the surrounding environment, such as a solar panel.

Also, as the voltage of one power source approaches 0V, the difference in potential between power sources increases, but the level shifting circuit of Japanese Patent Application Laid-Open Publication No. 2008-177755 does not take into account operations to handle differences in potential between the digital circuit power source and the analog circuit power source.

The present invention is proposed in order to solve the above-mentioned problems, and an object thereof is to provide a semiconductor device and a selector circuit by which it is possible to maintain a uniform output signal level regardless of the difference in potential between power sources with differing voltage values.

A semiconductor device according to an aspect of the invention includes a setting circuit including a latch circuit having first and second inverters driven by a first power voltage outputted from a first power source, a level of the first power voltage being fixed, the first and second inverters being configured to store data, and a first transistor configured to be switched between an ON state and an OFF state on the basis of a level of a second power voltage, a level of the second power voltage varying depending on an environment surrounding thereof, and to set data corresponding to a reference voltage to the latch circuit in response to the first transistor being switched to the ON state, and a reset circuit including an N-type second transistor that is connected to an output of the first inverter and an input of the second inverter, the second transistor being configured to set data corresponding to the reference voltage to the latch circuit in response to the second voltage being equal to or lower than a predetermined voltage value.

A selector circuit according to an aspect of the invention includes a semiconductor device, a selector circuit and an output terminal. The semiconductor device includes a setting circuit including a latch circuit having first and second inverters driven by a first power voltage outputted from a first power source, a level of the first power voltage being fixed, the first and second inverters being configured to store data, and a first transistor configured to be switched between an ON state and an OFF state on the basis of a level of a second power voltage, a level of the second power voltage varying depending on an environment surrounding thereof, and to set data corresponding to a reference voltage to the latch circuit in response to the first transistor being switched to the ON state, and a reset circuit including an N-type second transistor that is connected to an output of the first inverter and an input of the second inverter, the second transistor being configured to set data corresponding to the reference voltage to the latch circuit in response to the second voltage being equal to or lower than a predetermined voltage value. The selector circuit is connected to the first power source and the second power source, and to an output terminal of the semiconductor device that is configured to output a signal corresponding to the data set to the latch circuit. The selector circuit is configured to select the first power source or the second power source on the basis of the signal outputted from the output terminal. The output terminal is configured to output one of the first and second power voltages selected by the selector circuit.

The present invention exhibits the advantageous effect of being able to maintain a uniform output signal level regardless of the difference in potential between power sources with differing voltage values.

DETAILED DESCRIPTION OF THE INVENTION

Figure 1:
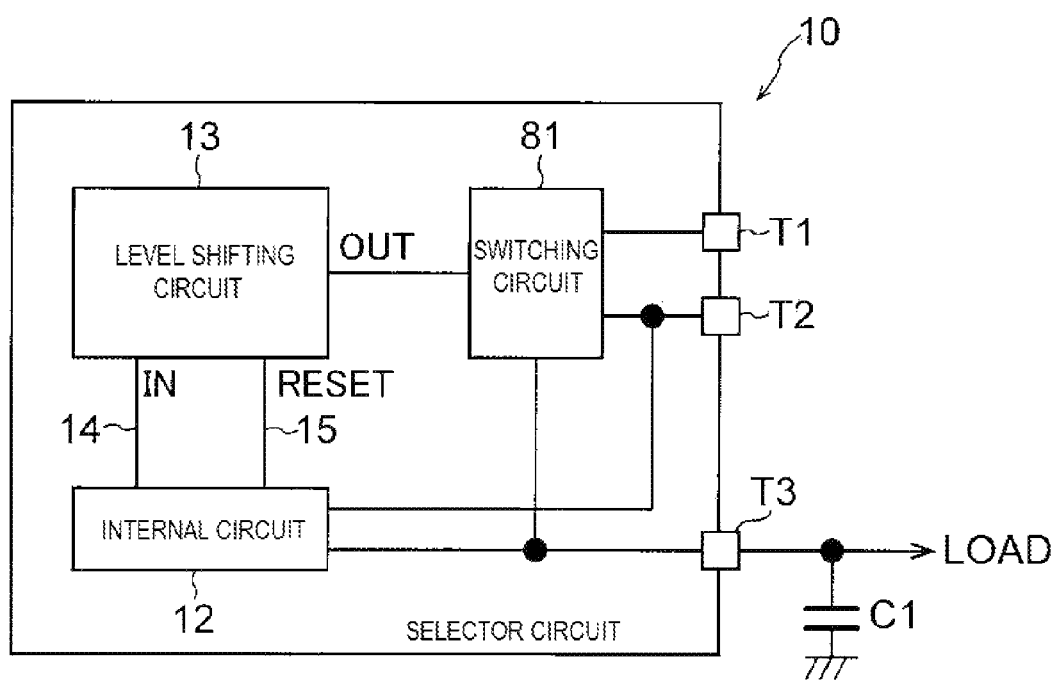
FIG. 1 shows a configuration example of a selector circuit according to an embodiment.

An example of an embodiment of a technique disclosed with reference to drawings will be explained in detail below. Components that perform the same functions are assigned the same reference characters for all drawings, and redundant explanations are sometimes omitted as appropriate.

Figure 5:
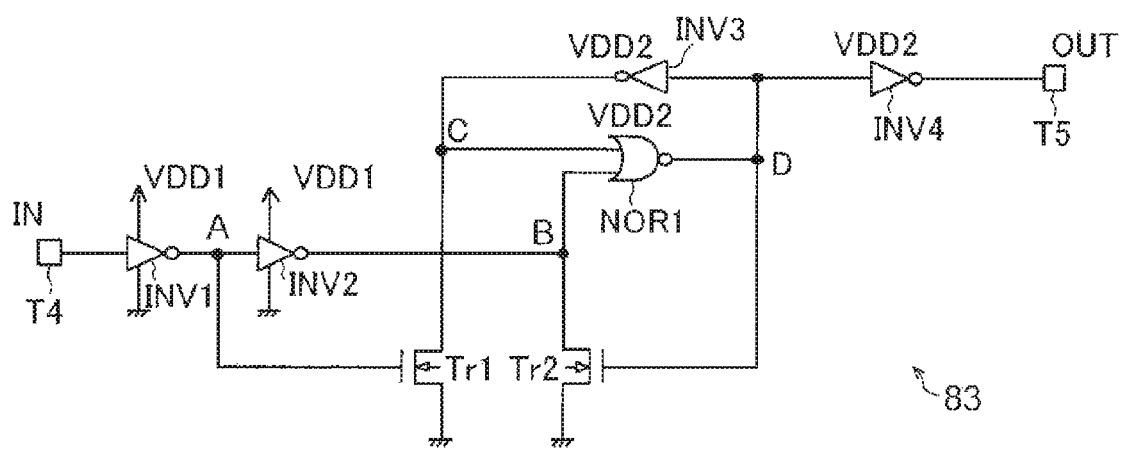
FIG. 5 is a circuit diagram showing an example of a related level shifting circuit.

FIG. 5 is a circuit diagram showing an example of a related level shifting circuit 83. The level shifting circuit 83 includes an IN terminal (hereinafter, the "terminal T4") into which a switching signal is inputted, a terminal T5 configured to output an output signal generated by the level shifting circuit 83, an N-type transistor Tr2, an N-type transistor Tr2, inverters INV1 to INV4, and a negative logical disjunction circuit NOR1.

In the level shifting circuit 83, the terminal T4 is connected to the input terminal of the inverter INV1, and the input terminal of the inverter INV2 is connected to the output terminal of the inverter INV1. Additionally, the output terminal of the inverter INV2 is connected a drain terminal of the transistor Tr2, which is connected to one input terminal of the negative logical disjunction circuit NOR1, a source terminal of the transistor Tr2 being connected to reference potential.

Meanwhile, the output terminal of the inverter INV1 is connected to a gate terminal of the transistor Tr1, which has a source terminal connected to reference potential and a drain terminal that is connected to the other input terminal of the negative logical disjunction circuit NOR1 and an output terminal of the inverter INV3.

Additionally, the output terminal of the negative logical disjunction circuit NOR1 is connected, respectively, to the gate terminal of the transistor Tr2, an input terminal of the inverter INV3, and an input terminal of the inverter INV4, and the output terminal of the inverter INV4 is connected to the terminal T5.

As an example, the inverter INV1 and the inverter INV2 are configured to be driven by VDD1, which is an output voltage from a solar panel, and the negative logical disjunction circuit NOR1, the inverter INV3, and the inverter INV4 are configured to be driven by VDD2, which is an output voltage from a battery.

Next, the operation of the level shifting circuit 83 connected as described above will be explained. In the level shifting circuit 83, if the switching signal inputted to the terminal T4 is "L", for example, then an output signal of "L" is outputted from the terminal T5. Also, if in the level shifting circuit 83 the switching signal inputted to the terminal T4 is "H", for example, then an output signal of "H" is outputted from the terminal T5.

The level of the switching signal inputted to the terminal T4 of the level shifting circuit 83 is assumed to differ from a signal level recognizable by the circuit connected to the terminal T5. Thus, in the level shifting circuit 83, the level of the switching signal is converted to the signal level recognizable by the circuit connected to the terminal T5 and outputted from the terminal T5.

First, the operation of the level shifting circuit 83 when the switching signal inputted to the terminal T4 is "L" will be described.

If the potential of the terminal T4 is set to "L", then the potential of a contact point A becomes "H" (specifically, VDD1), and the potential of a contact point B becomes "L". Thus, VDD1 is applied to the gate terminal of the transistor Tr1, which turns on the transistor Tr1 and causes the potential of a contact point C to be "L".

If, as described above, the potential of the terminal T4 is set to "L", then the potential inputted to both input terminals of the negative logical disjunction circuit NOR1 is "L", causing the potential of a contact point D to be set to "H". The drive voltage of the negative logical disjunction circuit NOR1 is VDD2, and thus, if the potential of the contact point D is "H", then the potential is VDD2.

By setting the potential of the contact point D to "H", the potential of the output terminal of the inverter INV3, that is the potential of the contact point C, is set to "L", while the transistor Tr2 is turned on and the potential of the contact point B is fixed to "L".

Thus, as a result of a latch circuit formed by the negative logical disjunction circuit NOR1 and the inverter INV3, the potential of the contact points B and C is kept at "L" and the potential of the contact point D is kept at "H", and thus, "L" is outputted from the terminal T5.

On the other hand, if the switching signal inputted to the terminal T4 is "H", then the potential of the contact point A becomes "L" and the potential of the contact point B becomes "H" (specifically VDD1). In such a case, a potential corresponding to "L" is applied to the gate terminal of the transistor Tr1, which turns off the transistor Tr1.

If the potential of one input terminal of the negative logical disjunction circuit NOR1 is "H", then the potential of the output terminal of the negative logical disjunction circuit NOR1, that is the potential of the contact point D, becomes "L". As already described, the potential of the contact point B is "H", causing the potential of the contact point D to become "L". Thus, the transistor Tr2 is turned off, and the potential of the output terminal of the inverter INV3, that is the potential of the contact point C, is set to "H".

In other words, as a result of the latch circuit formed by the negative logical disjunction circuit NOR1 and the inverter INV3, the potential of the contact points B and C is kept at "H" and the potential of the contact point D is kept at "L", and thus, "H" is outputted from the terminal T5.

Thus, even if the output voltage VDD1 of the solar panel were to drop to a level at which the inverters INV1 and INV2 cannot be driven (0.5V or less, for example), and the output signal level of the inverters INV1 and INV2 were to enter an unstable state, that is a high impedance state, the level shifting circuit 83 has a latch circuit that stores a logic value of "H" or "L" as data, enabling an output signal corresponding to the logic value stored in the latch circuit to be outputted from the terminal T5.

Meanwhile, due to the need for improvement in driving time in electronic devices and the like in recent years, there has been an increase in use of lithium-ion batteries for electronic devices due to lithium-ion batteries having a higher energy density and a longer charge/discharge lifespan than other chemical batteries such as nickel-hydrogen batteries, for example.

However, whereas the output voltage of lithium-ion batteries is approximately 3.6V, the output voltage of nickel-hydrogen batteries is approximately 1.2V, and thus, as lithium-ion batteries have become increasingly widely used, there has been an increase in the difference in potential between the output voltage VDD2 of the battery and the output voltage VDD1 of the solar panel.

If the difference in potential between VDD1 and VDD2 increases to approximately 2V or greater, for example, then this can result in the difference in potential between VDD1 and the negative logical disjunction circuit NOR1 driven by VDD2 resulting in the negative logical disjunction circuit NOR1 not operating, causing the level shifting circuit 83 to be unable to output an output signal corresponding to the switching signal from the terminal T5. Below, reasons for such a situation occurring will be described with reference to FIG. 6.

Figure 6:
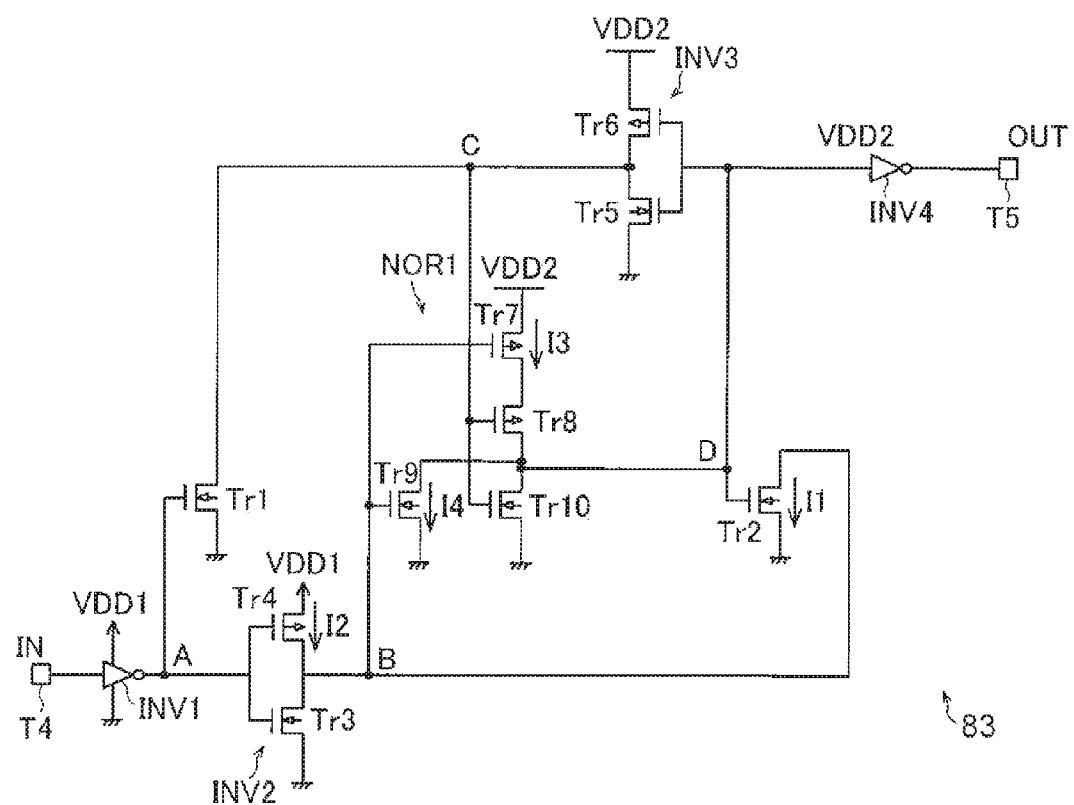
FIG. 6 is a circuit diagram showing details of a related level shifting circuit.

In the level shifting circuit 83 shown in FIG. 6 the internal circuitry of the inverters INV2 and INV3 and the negative logical disjunction circuit NOR1 is indicated with transistors, and the circuit shown in FIG. 6 is an equivalent circuit to the level shifting circuit 83 of FIG. 5.

Specifically, the gate terminals of the N-type transistor Tr3 and the P-type transistor Tr4 are connected to each other to form the input terminal of the inverter INV2, and the drain terminals of the transistors Tr3 and Tr4 are connected to each other to form the output terminal of the inverter INV2. In this case, the source terminal of the transistor Tr3 is connected to the reference potential, and the source terminal of the transistor Tr4 is connected to VDD1.

Also, similar to the inverter INV2, in the inverter INV3, the gate terminals of the N-type transistor Tr5 and the P-type transistor Tr6 are connected to each other to form the input terminal of the inverter INV3, and the drain terminals of the transistors Tr5 and Tr6 are connected to each other to form the output terminal of the inverter INV3. In this case, the source terminal of the transistor Tr5 is connected to the reference potential, and the source terminal of the transistor Tr6 is connected to VDD2.

Additionally, the gate terminals of the P-type transistor Tr7 and the N-type transistor Tr9 are connected to each other to form one input terminal of the negative logical disjunction circuit NOR1 connected to the output terminal of the inverter INV2, and the gate terminals of the P-type transistor Tr8 and the N-type transistor Tr10 are connected to each other to form the other input terminal of the negative logical disjunction circuit NOR1 connected to the output terminal of the inverter INV3. Also, the drain terminal of the transistor Tr7 and the source terminal of the transistor Tr8 are connected to each other, while the drain terminals of the transistors Tr9 and Tr10 are connected to each other to form the output terminal of the negative logical disjunction circuit NOR1. In this case, the source terminals of the transistors Tr9 and Tr10 are connected to reference potential, and the source terminal of the transistor Tr7 is connected to VDD2.

Below, using FIG. 6 and the potential change graph of FIG. 7 indicating an example of changes in potential of the terminals T4 and T5 and the contact points A to D over time, details of the operation of the level shifting circuit 83 for when the switching signal inputted to the terminal T4 changes from "L" to "H" will be described in detail.

As already described, if the switching signal inputted to the terminal T4 is "L", then the potential of the contact point D becomes "H", turning on the transistor Tr2 and setting the potential of the contact point B to "L". If, in this state, the switching signal inputted to the terminal T4 is set to "H", that is to VDD1, then the potential of the contact point B would also rise towards VDD1.

Figure 7:
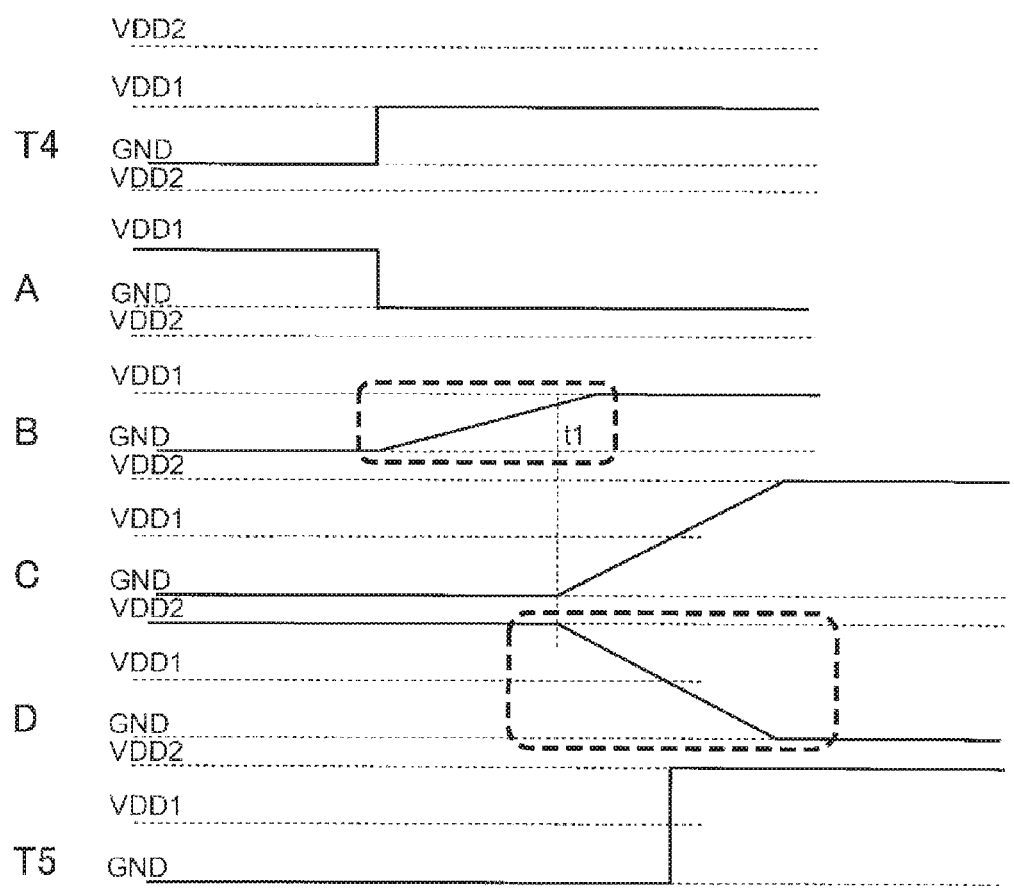
FIG. 7 is a graph showing an example of a change in potential in a related level shifting circuit.

However, at this point, the potential of the contact point B is set to "L", and thus, the potential of the contact point B does not rise to VDD1 when the switching signal inputted to the terminal T4 is set to "H", but rather the potential of the contact point B gradually approaches VDD1 while the transistor Tr4 allows through a source current I2 greater than a lead-in current I1 of the transistor Tr2 (see potential change graph of the contact point B of FIG. 7).

In order for the transistor Tr4 to pass through the source current I2, which is greater than the lead-in current I1 of the transistor Tr2 and raise the potential of the contact point B to VDD1, it is necessary to make the gate width of the transistor Tr4 long and increase the source current I2 flowing through the transistor Tr4, for example. Thus, the chip size (area) of the transistor Tr4, that is, the size of the transistor Tr4 tends to be larger than other P-type transistors.

Also, at time t1, if the potential at the contact point B is greater than or equal to a predetermined potential, then the transistor Tr9 turns on and the potential of the contact point D decreases towards "L".

However, at this point, the potential of the contact point D has risen to VDD2 as a result of both transistors Tr7 and Tr8 being on (see potential change graph of the contact point D of FIG. 7), and thus, the potential of the contact point D does not decrease to reference potential at the time t1, but rather the potential of the contact point D gradually approaches reference potential as a result of the transistor Tr9 allowing through a flow-through current I4 greater than the source current I3 of the transistor Tr7 (see potential change graph of the contact point d of FIG. 7).

At this time, the transistor Tr6 turns on as the potential of the contact point D drops, and the potential of the contact point C gradually rises from reference potential to VDD2 (see potential change graph of the contact point C of FIG. 7).

As the transistor Tr10 turns on when the potential of the contact point C becomes greater than or equal to a predetermined potential, the transistor Tr7 further draws in the source current I3, causing the potential of the contact point D to approach reference potential.

Once the potential of the contact point D is less than or equal to the predetermined potential and the transistor Tr2 turns off, the potential of the contact point B rises towards VDD1 and the output of the inverter INV3 reaches "H", causing the potential of the contact point C to be pulled up to VDD2. Thus, the transistor Tr10 turns on and the potential of the contact point D is set to reference potential.

In this manner, when the potentials of the contact points C and D are set and the switching signal inputted to the terminal T4 changes from "L" to "H", the operation of the level shifting circuit 83 ends.

However, if the difference in potential between VDD1 and VDD2 becomes greater than or equal to a certain potential, for example, then there are cases when the potential of VDD1 is insufficient to turn off the transistor Tr7, and the transistor Tr9 cannot allow through the source current I3 of the transistor Tr7 to a sufficient degree, preventing the potential of the contact point D from being set to reference potential. As a result, the level shifting circuit 83 cannot output an output signal corresponding to the switching signal from the terminal T5.

In order to lower the potential of the contact point D to reference potential with the transistors Tr7, Tr8, and Tr9 included in the negative logical disjunction circuit NOR1 being on, it is necessary for a current larger than the source current I3 of the transistor Tr7 to flow through the transistor Tr9.

In order to do so, it is necessary to make the gate width of the transistor Tr9 long and increase the source current I4 flowing through the transistor Tr9. Thus, in this case, the size of the transistor Tr9 tends to be larger than other N-type transistors.

In cases in which one power source is a solar panel with fluctuating output voltage due to the surrounding environment, and the other power source is a lithium-ion battery having a higher output voltage than nickel-hydrogen batteries or the like, for example, the setup has greater susceptibility to the difference in potential between the power sources being greater than or equal to a certain potential. Thus, the related level shifting circuit 83 sometimes cannot output an output signal corresponding to the switching signal from the terminal T5.

A state in which changes in the switching signal inputted to the terminal T4 result in a collision between the signal levels "H" and "L" seen at the contact points B and D, for example, is also referred to as "current collision" in the specification.

Below, a level shifting circuit that is able to maintain a uniform output signal level regardless of the difference in potential between power sources with differing voltage values will be described. In the description, portions corresponding to the content described above will be omitted.

FIG. 1 is a function block diagram showing an example of a selector circuit 10 including a level shifting circuit 13 according to the present embodiment.

The selector circuit 10 is configured to select a power source to be used on the basis of the voltage state of each of the plurality of power sources, for example, and to supply the voltage outputted from the selected power source to other circuits.

The selector circuit 10 includes a switching circuit 81, an internal circuit 12, the level shifting circuit 13, and terminals T1 to T3.

A battery (not shown) that outputs a predetermined voltage VDD2, for example, is connected to the terminal T1, and a solar panel (not shown) in which the output voltage VDD1 fluctuates according to the surrounding environment, for example, is connected to the terminal T2.

The switching circuit 81 is connected to the terminals T2 and T2, and is additionally connected to the terminal T3, the internal circuit 12, and the level shifting circuit 13.

The switching circuit 81 is configured to select either the voltage VDD2 outputted from the battery through the terminal T1, or the voltage VDD1 outputted from the solar panel through the terminal T2 on the basis of the output signal of the level shifting circuit 13 to be described later, and the voltage from the selected power source is outputted to the internal circuit 12 and the terminal T3.

The voltage of the power source outputted from the terminal T3 is supplied, through a capacitor C1 having one grounded terminal, for example, to a load such as an electronic device that can use a solar panel or a battery as the power source. The capacitor C1 is a bypass capacitor configured to remove noise in the voltage outputted from the terminal T3.

Meanwhile, the internal circuit 12 is connected to the terminal T2, the switching circuit 81, and the level shifting circuit 13. The internal circuit 12 is configured to be driven at a voltage selected by the switching circuit 81 and monitors the solar panel voltage VDD1 supplied from the terminal T2, for example, and if the voltage VDD1 is less than or equal to a threshold voltage, the internal circuit 12 generates a switching signal to switch to the battery as the power source, and if the voltage VDD1 of the solar panel exceeds the threshold, the internal circuit 12 generates a switching signal to switch to the solar panel as the power source, and outputs the switching signal through a connecting line 14 to an IN terminal of the level shifting circuit 13 to be described later.

In one example, the solar panel of the present embodiment is rated to a voltage of approximately 4V, but there is no restriction on the voltage rating of the solar panel, which naturally may be a value other than approximately 4V.

The internal circuit 12 monitors the voltage VDD1 of the solar panel connected to the terminal T2, and if VDD1 is 1V or less, the internal circuit 12 forcibly sets a RESET signal to "H" and outputs this signal to the level shifting circuit 13.

Thus, the internal circuit 12 and the level shifting circuit 13, in addition to being connected to a connecting line 14 that connects the internal circuit 12 and the IN terminal (T4 terminal) of the level shifting circuit 13, is connected to a connecting line 15 that connects the internal circuit 12 and a RESET terminal of the level shifting circuit 13 to be described later. The internal circuit 12 outputs the RESET signal to the level shifting circuit 13 through the connecting line 15.

In this example, the "H" signal level of the RESET signal is 1V, but the signal level of "H" for the RESET signal is not limited to 1V, and may be set to another potential.

The level shifting circuit 13 is connected to the switching circuit 81 and the internal circuit 12, generates an output signal according to a switching signal received from the internal circuit 12, and outputs the generated output signal to the switching circuit 81, thereby causing the switching circuit 81 to select as the power source either the battery or the solar panel, thereby switching the power source that supplies voltage to the load connected to the terminal T3.

Here, the level of the switching signal outputted by the internal circuit 12 is assumed to differ from a signal level recognizable by the switching circuit 81. Thus, in the level shifting circuit 13, the level of the switching signal is converted to the signal level recognizable by the switching circuit 81 and outputted thereto. For ease of explanation, the driving power source of the level shifting circuit 13 is omitted from FIG. 1, but the level shifting circuit 13 is driven by the battery and the solar panel as power sources.

The internal circuit 12 is connected to the terminal T2 and monitors the voltage of the solar panel (that is, VDD1) connected to the terminal T2, and if VDD1 is 1V or less, the internal circuit 12 forcibly sets a RESET signal to "H" and outputs this signal to the level shifting circuit 13.

Thus, the internal circuit 12 and the level shifting circuit 13, in addition to being connected to a connecting line 14 that connects the internal circuit 12 and the IN terminal (T4 terminal) of the level shifting circuit 13, is connected to a connecting line 15 that connects the internal circuit 12 and a RESET terminal of the level shifting circuit 13 to be described later. The internal circuit 12 outputs the RESET signal to the level shifting circuit 13 through the connecting line 15.

In this example, the "H" signal level of the RESET signal is 1V, but the signal level of "H" for the RESET signal is not limited to 1V, and may be set to another potential.

Figure 2:
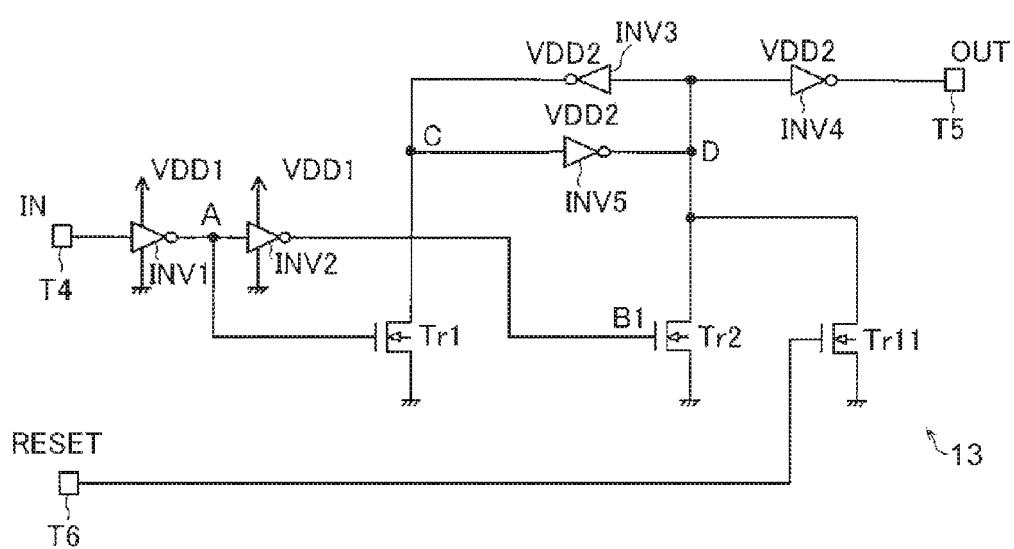
FIG. 2 is a circuit diagram showing an example of a level shifting circuit according to an embodiment.

FIG. 2 is a circuit diagram showing an example of the level shifting circuit 13 included in the selector circuit 10. The level shifting circuit 13 includes the terminal T4, the terminal T5, a RESET terminal (hereinafter referred to as the terminal T6) into which a RESET signal from the internal circuit 12 is inputted, transistors Tr1, Tr2, and Tr11, which are N-type transistors, and inverters INV1 to INV5.

The level shifting circuit 13 shown in FIG. 2 differs from the related level shifting circuit 83 shown in FIG. 5 in that the negative logical disjunction circuit NOR1 is replaced by the inverter INV5, and the latch circuit is formed by the inverters INV3 and INV5. As a result of the parts being replaced, the input terminal of the inverter INV5 is connected to the output terminal of the inverter INV3 and the drain terminal of the transistor Tr1. Also, the output terminal of the inverter INV5 is connected not to the gate terminal but to the drain terminal of the transistor Tr2, and instead, the output terminal of the inverter INV2 is connected to the gate terminal of the transistor Tr2.

The level shifting circuit 13 is additionally provided with a transistor Tr11 in which the gate terminal is connected to the terminal T6, the drain terminal is connected to the contact point D, and the source terminal is connected to reference potential.

As an example, the inverters INV1 and INV2 are driven by VDD1, which is an output voltage from a solar panel, and the inverters INV3 to INV5 are driven by VDD2, which is the output voltage from the battery.

Next, the operation of the level shifting circuit 13 connected as described above will be explained. In the level shifting circuit 13, similar to the level shifting circuit 83, if the switching signal inputted to the terminal T4 is "L", for example, then an output signal of "L" is outputted from the terminal T5, and as a result, the switching circuit 81 is controlled so as to select the battery as the power source supplying voltage to the load. Also, if the switching signal inputted to the terminal T4 is "H", for example, then the level shifting circuit 13 outputs an output signal of "H" from the terminal T5, thereby controlling the switching circuit 81 so as to select the solar panel as the power source supplying voltage to the load.

First, the operation of the level shifting circuit 13 when the switching signal inputted to the terminal T4 is "L" will be described. Here, the signal level of the terminal T6 is set to "L", that is the reference potential, and the terminal Tr11 is off.

If the potential of the terminal T4 is set to "L", then the potential of a contact point A becomes "H" (specifically, VDD1), and the transistor Tr1 turns on, resulting in the potential of a contact point C becoming "L". Thus, the input terminal of the inverter INV5 is set to reference potential, and therefore, the transistor Tr13 is turned on and the potential of the contact point D is fixed to "H". The drive voltage of the inverter INV5 is VDD2, and thus, if the potential of the contact point D specifically is "H", then the potential is VDD2.

On the other hand, the signal level of the gate terminal B1 of the transistor Tr2 is "L", and thus, the transistor Tr2 turns off. Thus, the potential of the contact point D remains stable at "H" without lowering.

By setting the potential of the input terminal of the inverter INV3 to "H" in this manner, the potential of the output terminal of the inverter INV3, that is the potential of the contact point C, is set to "L".

In other words, as a result of a latch circuit formed by the inverter INV3 and the inverter INV5, the potential of the contact point C is kept at "L" and the potential of the contact point D is kept at "H", and thus, a potential of "L" is outputted from the terminal T5.

Next, the operation of the level shifting circuit 13 when the switching signal inputted to the terminal T4 changes from "L" to "H" will be described with reference to FIG. 3.

Figure 3:
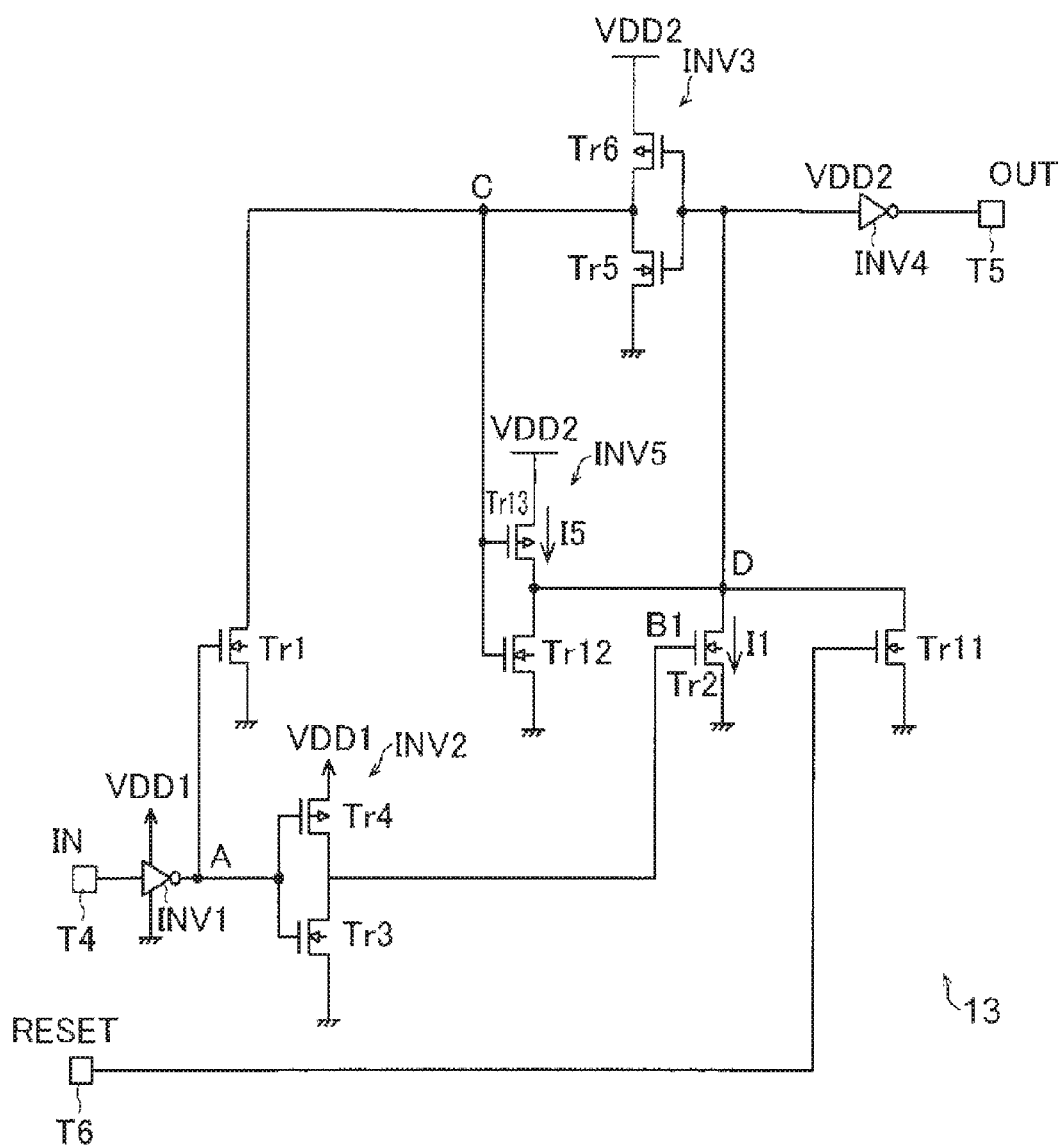
FIG. 3 is a circuit diagram showing details of a level shifting circuit according to an embodiment.

In the level shifting circuit 13 shown in FIG. 3, the internal circuitry of the inverters INV2, INV3 and INV5 is indicated with transistors, and this is an equivalent circuit to the level shifting circuit 13 of FIG. 2.

Specifically, the gate terminals of the N-type transistor Tr12 and the P-type transistor Tr13 are connected to each other to form the input terminal of the inverter INV5, and the drain terminals of the transistors Tr12 and Tr13 are connected to each other to form the output terminal of the inverter INV5. In this case, the source terminal of the transistor Tr12 is connected to the reference potential, and the source terminal of the transistor Tr13 is connected to VDD2.

As already described with reference to FIG. 6, the internal circuitry of the inverters INV2 and INV3 is also formed by combining N-type transistors and P-type transistors.

If the switching signal inputted to the terminal T4 changes from "L" to "H", then the potential of the contact point A becomes "L" and the transistor Tr1 turns off, and additionally, the signal level of the gate terminal B1 of the transistor Tr2 is set to "H" (specifically VDD1).

Thus, when the transistor Tr2 turns on and a lead-in current I1 larger than a source current I5 of the transistor Tr13 starts to be drawn into the transistor Tr2, the potential of the contact point D decreases. When the potential of the contact point D is less than or equal to the threshold voltage of the inverter INV3, the transistor Tr6 turns on. By this operation, the potential of the contact point C is set to "H", that is VDD2, the transistor Tr12 of the inverter INV5 turns on, and the transistor Tr13 turns off. Thus, as a result of the potential of the contact point D being set to reference potential, a latch circuit formed by the inverter INV3 and the inverter INV5 causes the potential of the contact point C to be kept at "H" and the potential of the contact point D to be kept at "L", and thus, a potential of "H" is outputted from the terminal T5.

In order for the transistor Tr2 to pass through the lead-in current I1, which is greater than the source current I5 of the transistor Tr13, and lower the potential of the contact point D to reference potential, it is necessary to make the gate width of the transistor Tr2 long and increase the lead-in current I1 flowing through the transistor Tr2, for example. Thus, it is preferable that the transistor Tr2 be approximately double or more the size of the transistor Tr13.

In this manner, when the potentials of the contact points C and D are set and the switching signal inputted to the terminal T4 changes from "L" to "H", the operation of the level shifting circuit 13 ends.

In the latch circuit of the level shifting circuit 83 shown in FIG. 5, VDD1 is sometimes applied as the "H" signal level to one input terminal of the negative logical disjunction circuit NOR1, but in the latch circuit of the level shifting circuit 13, VDD2 and not VDD1 is applied as the "H" signal level to the input terminals of both the inverters INV3 and INV5.

Thus, the level shifting circuit 13 can control the on/off state of the transistors constituting the latch circuit regardless of the difference in potential between VDD1 and VDD2. By the transistor Tr2 being on, "L" data is set to the contact point D of the latch circuit, and thus, the circuit including the transistor Tr2 and the latch circuit is also an example of a data setting circuit.

Next, the operation of the level shifting circuit 13 for when VDD1 has decreased to less than or equal to 1V and there is a possibility of instability in the output signal level of the inverters INV1 and INV2 will be described.

In this case, the internal circuit 12 causes the terminal T6 of the level shifting circuit 13 to be forcibly set to "H", turning on the transistor Tr11. Similar to the operation when the switching signal inputted to the terminal T4 is changed from "L" to "H", the terminal Tr1 being turned on causes the potential of the contact point D to start dropping, and by the transistors Tr6 and Tr12 being on, the potential of the contact point C remains stable at "H" and the potential of the contact point D remains stable at "L". Thus, the signal level outputted from the terminal T5 is set to "H".

As a result, when the terminal T6 is set to "H", the transistor Tr11 operates as a reset circuit that forcibly sets the output of the terminal T5 to "H", and switches the power source supplying voltage to the load to the battery.

The "H" signal level applied to the gate terminal of the transistor Tr11 is, in one example, fixed at 1V, and thus, even with the same logic value of "H", this signal level is sometimes lower than VDD1, which is the "H" signal level inputted to the gate terminal B1 of the transistor Tr2.

Thus, in order for the transistor Tr11 to pass through a lead-in current that is greater than the source current I5 of the transistor Tr13 and lower the potential of the contact point D to reference potential, it is necessary to make the gate width of the transistor Tr11 longer than the gate width of the transistor Tr2 and pass through a greater amount of current than the transistor Tr2, for example. Thus, the transistor Tr11 is approximately double or more the size of the transistor Tr2.

Also, in the level shifting circuit 13, an N-type transistor is used for the transistor Tr11. The fact that using an N-type transistor instead of a P-type transistor for the transistor Tr11 is suitable in reducing the circuit area will be described with reference to FIG. 4, which shows an example of a level shifting circuit 13A where a P-type transistor is used for the transistor Tr11.

Figure 4:
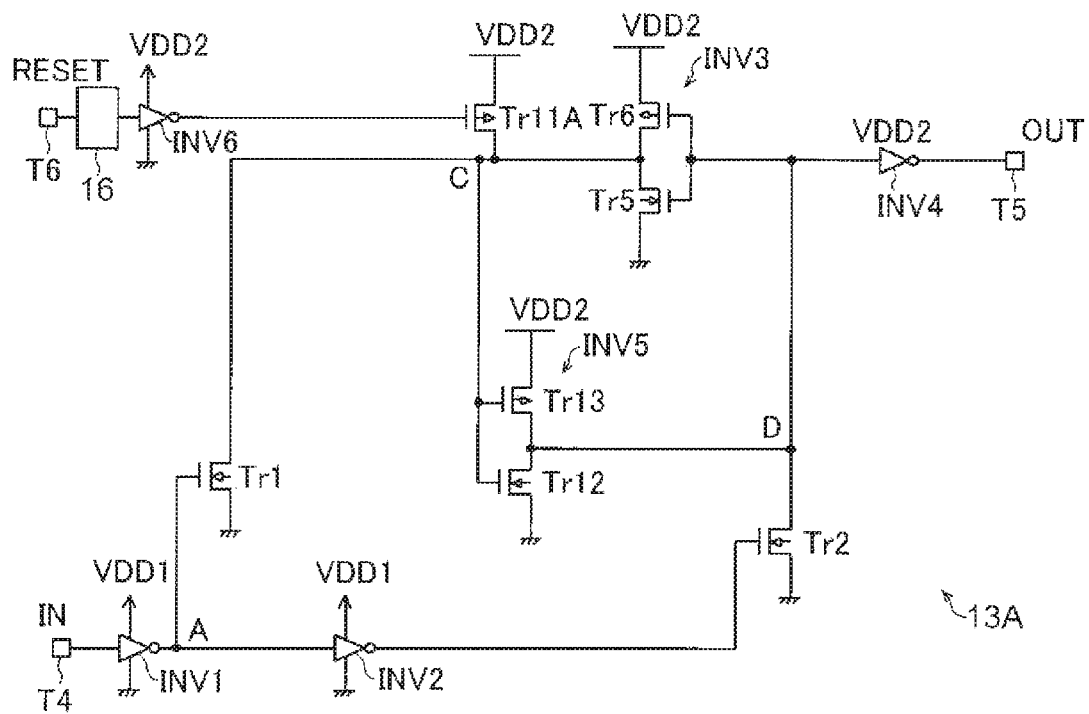
FIG. 4 is a circuit diagram showing an example of a level shifting circuit that uses a P-type transistor as a reset circuit.

In the level shifting circuit 13A of FIG. 4, a P-type transistor Tr11A corresponding to the transistor Tr11 of FIG. 3 is used.

In the level shifting circuit 13A, the terminal T6 is connected to an input terminal of a level shifter 16 to be described later, and the input terminal of the inverter INV6 is connected to the output terminal of the level shifter 16. Additionally, the output terminal of the inverter INV6 is connected to the gate terminal of the transistor Tr11A.

The "H" signal level at the input terminal of the latch circuit constituted of the inverters INV3 and INV5 is VDD2, and thus, whereas the source terminal of the transistor Tr11A is connected to VDD2, the drain terminal thereof is connected to the contact point C. By the drain terminal of the transistor Tr11A being connected to the contact point C, when the transistor Tr11A is on, the signal level of the contact point C is set to "H (=VDD2)", the signal level causing the transistor Tr12 to turn on, setting the potential of the contact point D to "L". Thus, the signal level outputted from the terminal T5 is set to "H", and output results similar to the level shifting circuit 13 of FIG. 3 can be attained.

However, in order to turn off the transistor Tr11A, it is necessary to apply VDD2 to the gate terminal of the transistor Tr11A. Thus, in the level shifting circuit 13A, it is necessary to provide a level shifter 16 that converts the signal level of VDD1 inputted to the terminal T6 to the VDD2 signal level.

In other words, if a P-type transistor is used for the transistor Tr11 of the level shifting circuit 13, the level shifter 16 needs to be separately provided in the level shifting circuit 13, which results in an increase in size of the level shifting circuit 13 compared to a case in which an N-type transistor is used for the transistor Tr11.

Also, hole mobility is less than electron mobility, and thus, in order to pass through the same amount of current between source and drain, a P-type transistor would need to be approximately double the size of an N-type transistor.

Thus, if a P-type transistor is used for the transistor Tr11 of the level shifting circuit 13, this would result in an even further increase in size of the level shifting circuit 13 compared to a case in which an N-type transistor is used.

By the reasons stated above, an N-type transistor is used for the transistor Tr11 of the level shifting circuit 13.

In this manner, in the level shifting circuit 13 of the present embodiment, the voltage VDD2, which is the same as the drive voltage of the inverters INV3 and INV5, and not the voltage VDD1, which fluctuates according to the output voltage of the solar panel, is used as the signal level inputted to the latch circuit constituted of the inverters INV3 and INV5.

Thus, the level shifting circuit 13 can control the on/off state of the transistors constituting the latch circuit regardless of the difference in potential between VDD1 and VDD2, achieving a fixed output signal level for the terminal T5.

Also, the level shifting circuit 13 includes a reset circuit including the transistor Tr11, as described above. Thus, even if the output voltage of the solar panel decreases, and the inverter INV1 in a device driven by the voltage of the solar panel is in a high impedance state, for example, the reference potential can be set for the latch circuit using the reset circuit, which allows for switching of the power source supplying voltage to a load from the solar panel to a battery.

Also, when changing the switching signal from "L" to "H", whereas in the related level shifting circuit 83, there would be two current collisions, in the level shifting circuit 13, there is only one current collision.

Specifically, in the level shifting circuit 83 of FIG. 6, there would be a current collision between the source current I2 of the transistor Tr4 and the lead-in current I1 of the transistor Tr2 at the contact point B, and a current collision between the source current I3 of the transistor Tr7 and the flow-through current I4 of the transistor Tr9 at the contact point D.

By contrast, in the level shifting circuit 13 of FIG. 3, there would only be a current collision between the source current I5 of the transistor Tr13 and the lead-in current I1 of the transistor Tr2 at the contact point D.

In other words, as a countermeasure against current collision, a larger lead-in current is drawn in by the N-type transistor, and thus, in the level shifting circuit 83, both the transistors Tr2 and Tr9 need to be larger than other similar transistors, but in the level shifting circuit 13, only the transistor Tr2 needs to be larger than the transistor Tr13.

Thus, it is possible to achieve a smaller size for the level shifting circuit 13 compared to the level shifting circuit 83.

Also, in the level shifting circuit 13, the negative logical disjunction circuit NOR1 of the level shifting circuit 83 of FIG. 6 is replaced by the inverter INV5, and thus, even if the transistor Tr11 functioning as a reset circuit is added, the number of P-type transistors can be reduced by one compared to the level shifting circuit 83.

Thus, it is possible to achieve an even smaller size for the level shifting circuit 13 compared to the level shifting circuit 83.

Also, in the level shifting circuit 13, if the signal level for the latch circuit is set by the transistor Tr2 or the transistor Tr11, then a reference potential that is in common between the solar panel and the battery is set. Thus, when setting the signal level of the latch circuit, the configuration of the level shifting circuit 13 is simplified compared to a case in which "H" signal levels having differing potentials as in VDD1 or VDD2 are used.

Embodiments of the present invention have been described above, but the technical scope of the present invention is not limited to the embodiments above. Various modifications or improvements can be made to the embodiments above without departing from the spirit of the invention, and such modifications or improvements are also included within the technical scope of the present invention.

For example, the terminals T4 to T6 have been described as internal terminals inside the level shifting circuit 13, but the locations at which the terminals T4 to T6 are installed are not limited thereto, and may be provided outside of the level shifting circuit 13.

What is claimed is:

1. A semiconductor device for switching from a second power voltage to a first power voltage that are used in an other circuit outside of the semiconductor device, comprising:
    a setting circuit including
        a latch circuit having first and second inverters driven by the first power voltage outputted from a first power source, a level of the first power voltage being fixed, the first and second inverters being configured to store data, and
        a first transistor configured
            to be switched between an ON state and an OFF state on the basis of a level of the second power voltage outputted from a second power source that a source of solar power, a level of the second power voltage varying depending on an environment surrounding thereof, and
            to set data corresponding to a reference voltage to the latch circuit in response to the first transistor being switched to the ON state; and
    a reset circuit including an N-type second transistor that is connected to an output of the first inverter and an input of the second inverter, the second transistor being configured to set data corresponding to the reference voltage to the latch circuit in response to the second power voltage being equal to or lower than a predetermined voltage value, for the switching from the second power voltage to the first power voltage in the other circuit, the second transistor being at least double the size of the first transistor.

2. A semiconductor device for switching from a second power voltage to a first power voltage that are used in an other circuit outside of the semiconductor device, comprising
    a setting circuit including
        a latch circuit having first and second inverters driven by the first power voltage outputted from a first power source, a level of the first power voltage being fixed, the first and second inverters being configured to store data, the first invertor including a P-type transistor, and
        a first transistor configured
            to be switched between an ON state and an OFF state on the basis of a level of the second power voltage outputted from a second power source that is a source of solar power, a level of the second power voltage varying depending on an environment surrounding thereof, and
            to set data corresponding to a reference voltage to the latch circuit in response to the first transistor being switched to the ON state, the first transistor being at least double the size of the P-type transistor included in the first inverter; and
    a reset circuit including an N-type second transistor that is connected to an output of the first inverter and an input of the second inverter, the second transistor being configured to set data corresponding to the reference voltage to the latch circuit in response to the second power voltage being equal to or lower than a predetermined voltage value, for the switching from the second power voltage to the first power voltage in the other circuit.

3. A selector circuit, comprising:
    a semiconductor device, including
        a setting circuit including
            a latch circuit having first and second inverters driven by a first power voltage outputted from a first power source, a level of the first power voltage being fixed, the first and second inverters being configured to store data, and
            a first transistor configured
                to be switched between an ON state and an OFF state on the basis of a level of a second power voltage, a level of the second power voltage varying depending on an environment surrounding thereof, and
                to set data corresponding to a reference voltage to the latch circuit in response to the first transistor being switched to the ON state; and
        a reset circuit including an N-type second transistor that is connected to an output of the first inverter and an input of the second inverter, the second transistor being configured to set data corresponding to the reference voltage to the latch circuit in response to the second power voltage being equal to or lower than a predetermined voltage value;
    a selector circuit connected to the first power source and the second power source, and to an output terminal of the semiconductor device that is configured to output a signal corresponding to the data set to the latch circuit, the selector circuit being configured to select the first power source or the second power source on the basis of the signal outputted from the output terminal; and
    an output terminal configured to output one of the first and second power voltages selected by the selector circuit.

4. The selector circuit according to claim 3, wherein the first invertor includes a P-type transistor, and
    a size of the first transistor is greater than that of the P-type transistor included in the first inverter.

5. The selector circuit according to claim 3, wherein the second transistor is greater in size-than the first transistor.

6. The selector circuit according to claim 1, further comprising a first connection line connected between the setting circuit and the other circuit, the other circuit monitoring the level of the second power voltage, wherein
    the first transistor receives a setting signal through the first connection line, the setting signal being generated based on the level of the second power voltage.

7. The selector circuit according to claim 6, wherein the second transistor sets the data corresponding to the reference voltage to the latch circuit, and
    in response to the data set from the latch circuit, the latch circuit outputs a switching signal configured to switch from the second power voltage to the first power voltage in the other circuit.

8. The selector circuit according to claim 6, further comprising a second connection line connected between the setting circuit and the other circuit, wherein
the reset circuit receives the reset signal indicating whether the second power voltage is equal to or lower than the predetermined voltage value.

9. The selector circuit according to claim 3, further comprising a first connection line connected between the setting circuit and the other circuit, the other circuit monitoring the level of the second power voltage, wherein
the first transistor receives a setting signal through the first connection line, the setting signal being generated based on the level of the second power voltage.

10. The selector circuit according to claim 9, wherein
the second transistor sets the data corresponding to the reference voltage to the latch circuit, and
in response to the data set from the latch circuit, the latch circuit outputs a switching signal configured to switch from the second power voltage to the first power voltage in the other circuit.

11. The selector circuit according to claim 9, further comprising a second connection line connected between the setting circuit and the other circuit, wherein
the reset circuit receives the reset signal indicating whether the second power voltage is equal to or lower than the predetermined voltage value.

\* \* \* \* \*